United States Patent
Matsui et al.

(10) Patent No.: US 7,307,909 B2
(45) Date of Patent: Dec. 11, 2007

(54) SELF-REFRESH TIMER CIRCUIT AND METHOD OF ADJUSTING SELF-REFRESH TIMER PERIOD

(75) Inventors: Yoshinori Matsui, Tokyo (JP); Hitoshi Tanaka, Tokyo (JP); Kazuhiko Kajigaya, Tokyo (JP); Akiyoshi Yamamoto, Tokyo (JP); Tadashi Onodera, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 75 days.

(21) Appl. No.: 11/297,646

(22) Filed: Dec. 9, 2005

(65) Prior Publication Data

US 2006/0145667 A1    Jul. 6, 2006

(30) Foreign Application Priority Data

Dec. 10, 2004   (JP) .............................. 2004-359233

(51) Int. Cl.
    *G11C 11/406*    (2006.01)
(52) U.S. Cl. ...................... 365/222; 365/211; 365/233
(58) Field of Classification Search ................. 365/211
    See application file for complete search history.

(56) References Cited

U.S. PATENT DOCUMENTS 5,898,343 A * 4/1999 Morgan ....................... 331/57
6,329,642 B1 * 12/2001 Kaneko et al. ............. 219/497
6,956,397 B2 * 10/2005 Lim et al. ...................... 326/31
2003/0189859 A1 * 10/2003 Takahashi et al. .......... 365/200

FOREIGN PATENT DOCUMENTS

JP    2002-117671    4/2002

OTHER PUBLICATIONS

Kim et al.; "A Low-Power 256-Mb SDRAM With an On-Chip Thermometer and Biased Reference Line Sensing Scheme"; *IEEE Journal of Solid-State Circuits*; vol. 38, No. 2; c. 2003; pp. 329-337.

* cited by examiner

*Primary Examiner*—Tan T. Nguyen
(74) *Attorney, Agent, or Firm*—McDermott Will & Emery LLP

(57) ABSTRACT

A self-refresh timer circuit for generating a timer period for controlling self-refresh operation of a semiconductor memory device comprising: a temperature-dependent voltage source for outputting a voltage having a temperature dependency based on a diode characteristic; a control current generating circuit for applying an output voltage of the temperature-dependent voltage source to a temperature detecting device having a diode characteristic and for generating a control current having a magnitude in proportion to a current flowing through the temperature detecting device; and a timer period generating circuit for generating a timer period in inverse proportion to the magnitude of the control current.

12 Claims, 15 Drawing Sheets

SELF-REFRESH TIMER CIRCUIT AND METHOD OF ADJUSTING SELF-REFRESH TIMER PERIOD

BACKGROUND OF THE INVENTION

1. Field of the Invention

The present invention relates to a self-refresh timer circuit which generates a timer period for controlling a self-refresh operation of a semiconductor memory device.

2. Related Art

A DRAM which is a typical semiconductor memory device is configured to execute self-refresh at predetermined intervals for holding data. In general, self-refresh operation is periodically performed so that a self-refresh timer circuit which generates a timer period for controlling timing of self-refresh operation is built in the DRAM. In general, when performing self-refresh, the longer the timer period is, the less the power consumption of the DRAM. For example, since low power consumption is strongly required in the DRAM for mobile use or the like, self-refresh is preferably performed by using the longest timer period as possible.

On the other hand, it is known that a data retention time of a memory cell of the DRAM has a temperature dependency, and the data retention time is decreased according to powers of temperature with increase of the temperature. Therefore, it can be assumed under the high-temperature environment that the timer period exceeds the data retention time, thereby performing an inappropriate refresh operation, even if a predetermined timer period is set so as to secure a desired data retention time in a room temperature. In order to solve the above-mentioned problem, a variety of methods for controlling the timer period according to temperature has been suggested. As a first method, for example, a configuration in which temperature measuring means is provided in the semiconductor memory device and the timer period is switched stepwise according to the measured temperature is proposed (refer to "A low-power 256-Mb SDRAM with an on-chip thermometer and biased reference line sensing scheme" IEEE Journal of Solid-State Circuits, Vol. 38, No. 2, February 2003). And as a second method, a configuration capable of adjusting the timer period so as to suit the data retention time by using a diode whose characteristic changes according to powers of temperature and by controlling the temperature characteristic of the diode (refer to Japanese Patent Application Laid-Open No. 2002-117671).

However, according to the above-described first method, the timer period abruptly changes at each switching temperature point when the timer period is switched stepwise according to the temperature. For example, when the timer period is switched stepwise at switching temperature points Tp1, Tp2 and Tp3 as shown in FIG. 15, control is performed according to a temperature characteristic which does not exceed a temperature characteristic Cm of the data retention time of the memory cell. In this case, since the linear temperature characteristic Cm of the data retention time is approximated by a stepwise pattern, the timer period deviates from the data retention time in the vicinity of the switching temperature points and becomes short, especially when the number of the switching temperature points decreases. Consequently, it becomes a problem that the power consumption is not sufficiently reduced. On the other hand, in order to avoid such a problem, the timer period may be controlled in a multistage stepwise pattern by setting a number of switching temperature points. But in this case, it becomes a problem that components such as a switch circuit for setting timer period to be switched, a decoder for program, a fuse and the like increase, and layout area is increased.

Further, according to the above-described second method, in order to finely control the temperature characteristic of the timer period, it is required to provide a plurality of series-connected diodes. However, considering that a forward drop voltage of the diode is approximately 0.6V, the number of diodes to be connected is restricted by a supply voltage. For example, if an operating voltage drops to 1.5V, the number of diodes to be series-connected is limited to two, and the fine control of the timer period is prevented. The configuration in which a plurality of diodes is series-connected is not preferable to a low-voltage DRAM.

SUMMARY OF THE INVENTION

An object of the present invention is to supply a self-refresh timer circuit which can optimize a timer period for data retention time by controlling the timer period according to a smooth temperature characteristic, avoid an increase of layout area by reducing a number of components for switching the timer period, and finely control the timer period even in low power operation.

An aspect of the present invention is a self-refresh timer circuit for generating a timer period for controlling self-refresh operation of a semiconductor memory device comprising: a temperature-dependent voltage source for outputting a voltage having a temperature dependency based on a diode characteristic; a control current generating circuit for applying an output voltage of said temperature-dependent voltage source to a temperature detecting device having a diode characteristic and for generating a control current having a magnitude in proportion to a current flowing through said temperature detecting device; and a timer period generating circuit for generating a timer period in inverse proportion to the magnitude of said control current.

According to the aspect of the present invention, attention is paid to the diode characteristic to approximate the temperature characteristic of a data retention time when performing self-refresh, and the temperature characteristic of the timer period is controlled by using a diode current which varies continuously and exponentially with the temperature. First, the voltage having the temperature dependency based on the diode characteristic is output, and the output voltage is applied between anode and cathode of the diode or between emitter and base of a diode-connected bipolar transistor. The control current is generated based on the current flowing at this time, and a timer period which is in inverse proportion to the magnitude of the control current is generated. Thereby, the timer period having a temperature characteristic which suits the temperature characteristic of the data retention time is easily obtained by adjusting parameters, and self-refresh by using the optimal refresh period can be performed under a condition in which surrounding temperature varies. At this time, since the components for discontinuously switching the timer period and a plurality of series-connected diodes are not needed, and the semiconductor memory device which suits low power operation can be realized without increase in layout area by implementing the self-refresh timer circuit of the present invention.

The self-refresh timer of the present invention may further comprise adjusting means including first adjusting means for adjusting coefficient of powers of temperature in a temperature characteristic of said timer period and second adjusting means for adjusting logarithmic level of the temperature characteristic of said timer period.

In the self-refesh timer of the present invention, said first adjusting means may adjust the coefficient of powers of temperature by changing the output voltage level of said temperature-dependent voltage source, and said second adjusting means may adjust the logarithmic level by changing the magnitude of said control current.

In the self-refesh timer of the present invention, first adjusting means can select a predetermined output voltage level from a plurality of preset output voltage levels different from each other, and said second adjusting means can select a predetermined magnitude of said control current from a plurality of preset magnitudes different from each other.

In the self-refresh timer of the present invention, said adjusting means can change the output voltage level and the magnitude of said control current so as to maintain the same said timer period at a preset high-temperature measurement point.

In the self-refresh timer of the present invention, said control current generating circuit may generate said control current by transmitting the current flowing through said temperature detecting device using a current mirror having a mirror ratio which can be switched, and said second adjusting means may change the magnitude of said control current according to switching control of said mirror ratio.

In the self-refresh timer of the present invention, said temperature-dependent voltage source may output a voltage of a voltage dividing circuit capable of switching a division ratio of resistors, and said first adjusting means may change the output voltage level according to switching control of said division ratio.

In the self-refresh timer of the present invention, said control current generating circuit may have a feedback circuit which maintains the magnitude of said control current constant beneath a predetermined temperature by a negative feedback.

In the self-refresh timer of the present invention, said control current generating circuit can change said predetermined temperature by controlling a magnitude of the negative feedback of said feedback circuit.

An aspect of the present invention is a self-refresh timer period adjusting method for adjusting said timer period of above-mentioned self-refresh timer. In this method of the present invention, it is possible to select a desired temperature characteristic to which said timer period conforms at a preset high-temperature measurement point from temperature characteristics obtained by adjusting the coefficient of powers of temperature and the logarithmic level of the temperature characteristic of said timer period.

In the method of the present invention, it is possible to select a desired temperature characteristic by adjusting one of or both of the coefficient of powers of temperature and the logarithmic level at a preset low-temperature measurement point from temperature characteristics to which said timer period conforms at said high-temperature measurement point.

In the method of the present invention, said timer period at said desired temperature characteristic can be adjusted so as to be slightly below a temperature characteristic determined by a data retention time of a memory cell.

As described above, according to the present invention, the timer period which varies continuously and exponentially with the temperature can be generated, wherein the control current is generated by using the voltage having the temperature dependency based on the diode characteristic and the temperature detecting device having the diode characteristic and the timer period which is in inverse proportion to the control current is generated. In this case, since coefficient of powers of temperature and logarithmic level of the temperature characteristic of the timer period are flexibly adjusted, the timer period having the temperature characteristic which suits the data retention time of the memory cell can be easily obtained, and self-refresh using an optimal refresh period in a condition in which a surround temperature varies can be always performed. Further, according to the present invention, since components for discontinuously switching the timer period and a plurality of series-connected diodes are not needed, a semiconductor memory device which suits low power operation without increasing the layout area can be realized.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Embodiments of the present invention will be described below with reference to the drawings. Herein, two embodiments (first and second embodiments) will be described as a self-refresh timer circuit of the present invention.

First Embodiment

Basic configuration and function of a self-refresh timer circuit of a first embodiment will be described.

Figure 1:
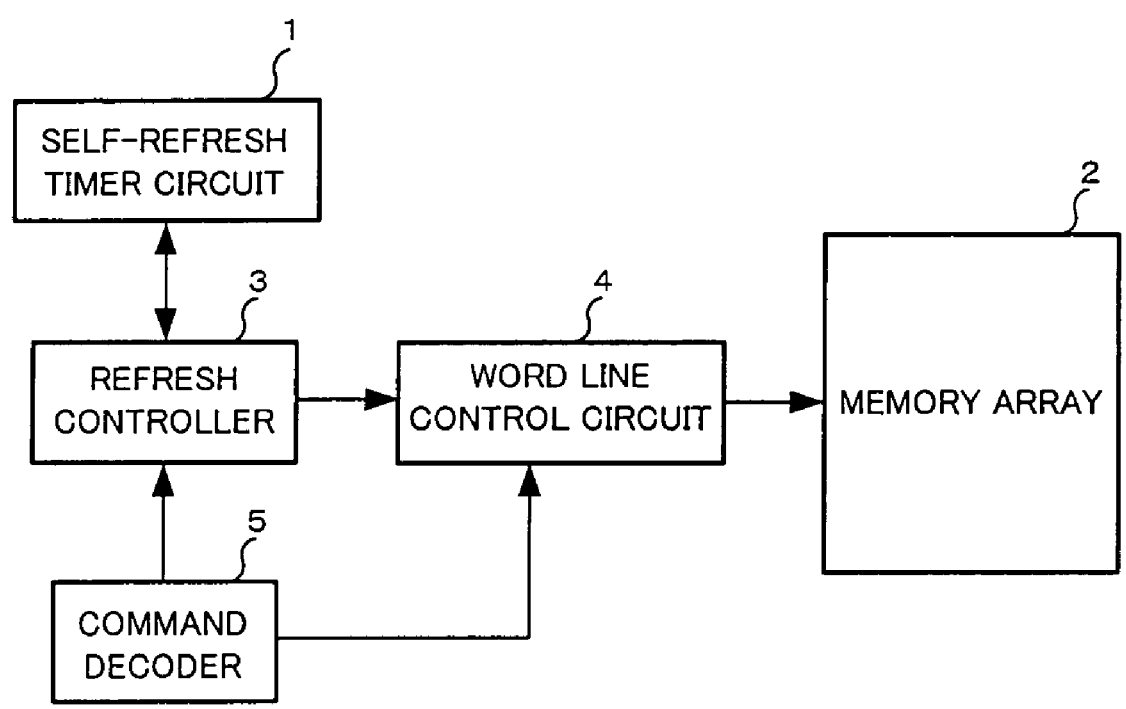
FIG. 1 is a block diagram showing a configuration of an essential part in a case in which a self-refresh timer circuit of the first embodiment is applied to a semiconductor memory device.

FIG. 1 is a block diagram showing a configuration of an essential part in a case in which a self-refresh timer circuit 1 of the first embodiment is applied to a semiconductor memory device such as a DRAM. In FIG. 1, the configuration required when performing self-refresh operation for holding data of a memory array 2 comprised of a number of memory cells. A refresh controller 3 controls the self-refresh operation for the memory array 2. In doing so, the refresh controller 3 determines the timing of performing self-refresh based on a timer period signal output from the self-refresh timer circuit 1. When performing self-refresh, a word line corresponding to a row address designated by the self-refresh controller 3 is selected by a word line control circuit 4, and each memory cell on the selected word line of the memory array 2 is refreshed. And, a command decoder 5 analyzes various commands including the start or end of the self-refresh operation thereby transmitting the analysis result to the refresh controller 3 and the word line control circuit 4.

Figure 2:
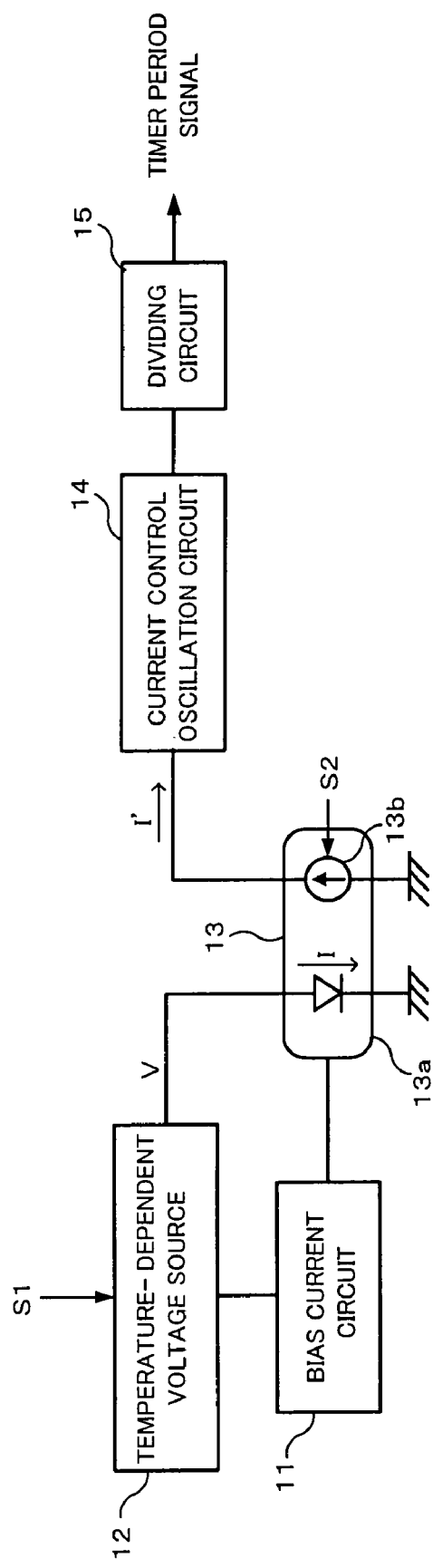
FIG. 2 is a functional block diagram of the self-refresh timer circuit of the first embodiment.

Next, FIG. 2 is a functional block diagram of the self-refresh timer circuit 1 of the first embodiment. The self-refresh timer circuit 1 shown in FIG. 2 includes a bias current circuit 11, a temperature-dependent voltage source 12, a control current generating circuit 13 composed of a temperature detecting diode 13a and a current source 13b, a current control oscillation circuit 14, and a dividing circuit 15.

In the above-described configuration, the temperature-dependent voltage source 12 is the voltage source which outputs a voltage V having a temperature dependency in which output level varies based on a diode characteristic. Temperature-dependent degree of the temperature-dependent voltage source 12 can be adjusted based on a control signal S1. In the control current generating circuit 13, the voltage V output from the temperature-dependent voltage source 12 is applied to the temperature detecting diode 13a which serves as a temperature-detecting device of the present invention. Thereby, a current I based on the diode characteristic flows through the temperature detecting diode 13a, and a control current I' having a magnitude which is in proportion to that of the current I is generated in the current source 13b to be output. A proportional coefficient between the current I and the control current I' in the control current generating circuit 13 can be adjusted based on a control signal S2. The bias current circuit 11 is a constant current source which supplies a reference bias current to the temperature-dependent voltage source 12 and the control current generating circuit 13.

The current control oscillation circuit 14 is a circuit for generating an oscillation signal having a period which is in inverse proportion to the magnitude of the control current I' output from the control current generating circuit 13. The dividing circuit 15 divides the oscillation signal of the current control oscillation circuit 14 by N to output a timer period signal having an N times period. A division factor N in the dividing circuit 15 may be appropriately set according to the data retention time. By controlling timing of the self-refresh operation based on thus obtained timer period signal, an optimal timer period which can compensate the temperature characteristic of the data retention time can be secured.

In addition, the control current generating circuit 13 serves as control current generating means of the present invention, and the current control oscillation circuit 14, along with the dividing circuit 15, serves as timer period generating means of the present invention.

Figure 3:
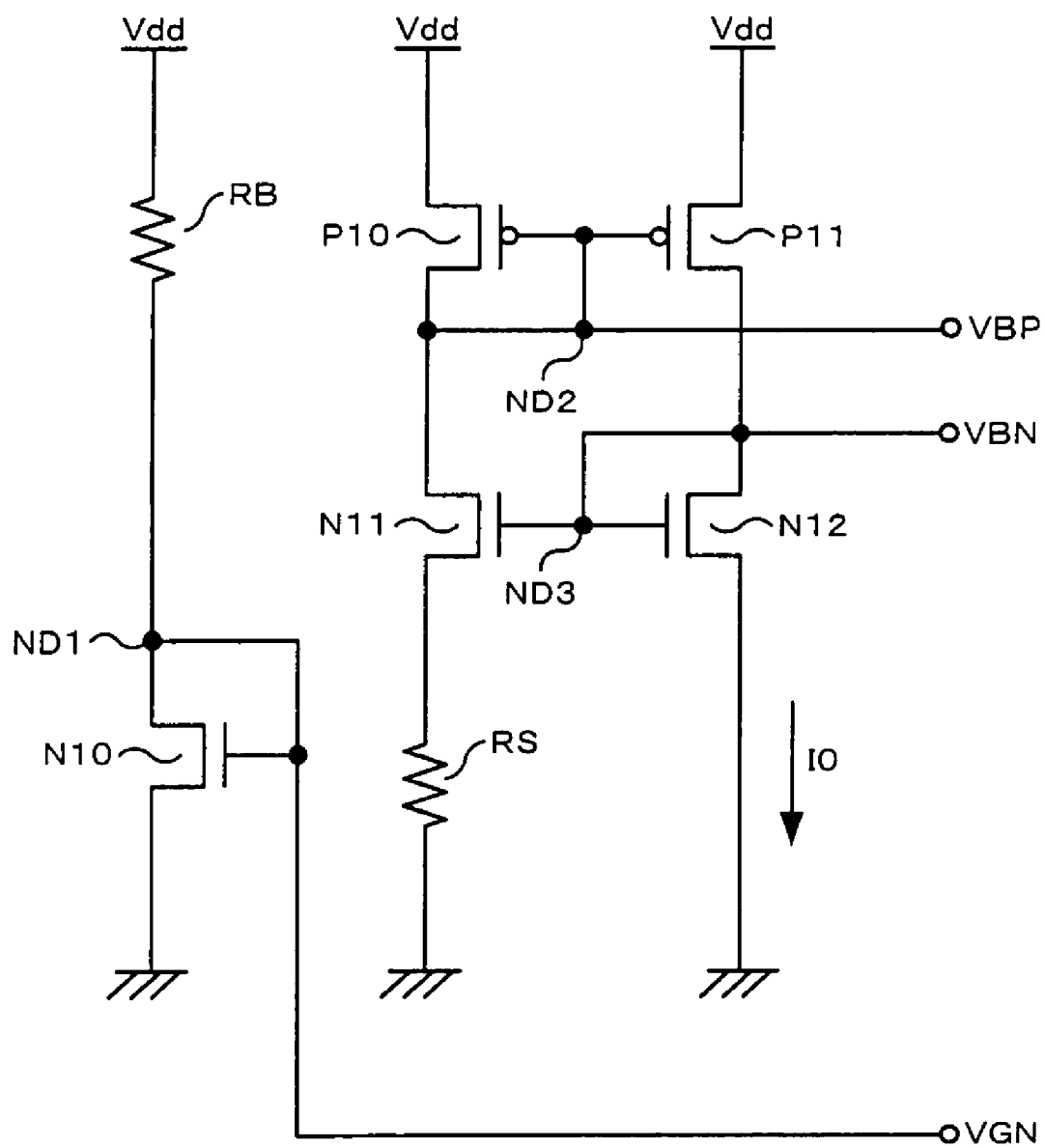
FIG. 3 is a view showing an example of a circuit configuration of a bias current circuit.

Hereinafter, a circuit configuration will be described more specifically concerning each component of the self-refresh timer circuit 1 shown in FIG. 2. FIG. 3 is a view showing an example of the circuit configuration of the bias current circuit 11. The bias current circuit 11 shown in FIG. 3 includes a first circuit composed of a resistor RB and an NMOS transistor N10, and a second circuit composed of a resistor RS, PMOS transistors P10 and P11 and NMOS transistors N11 and N12. In the first circuit, a supply voltage Vdd is supplied so that a constant current flows and a reference voltage VGN is output from node ND1. In the second circuit, the supply voltage Vdd is supplied so that a predetermined current I0 flows and reference voltages VBP and VBN are output from nodes ND2 and ND3, respectively. Herein, the current I0 is represented by following formula (1):

$$I0 = \frac{\frac{n \cdot k \cdot T}{q} \cdot \ln\left(\frac{Wa}{Wb}\right)}{RS} \tag{1}$$

where n: emission coefficient (in general, n=1 for silicon)

k: Boltzmann constant ($1.38 \times 10-23$ J/K)

T: absolute temperature (K)

q: charge of electron ($1.60 \times 10^{-19}$ C)

Wa: channel width of NMOS transistor N11

Wb: channel width of NMOS transistor N12

The current I0 represented by the formula (1) varies depending on a channel width ratio of the NMOS transistors N11 and N12 and the PMOS transistors P10 and P11, and the resistance value of the resistor RS. In this case, since the temperature dependency of the current I0 represented by the formula (1) is sufficiently small as compared with a diode current which defines a temperature characteristic of the timer period to be described later, the operation characteristic of the self-refresh timer circuit 1 is not largely affected.

Figure 4:
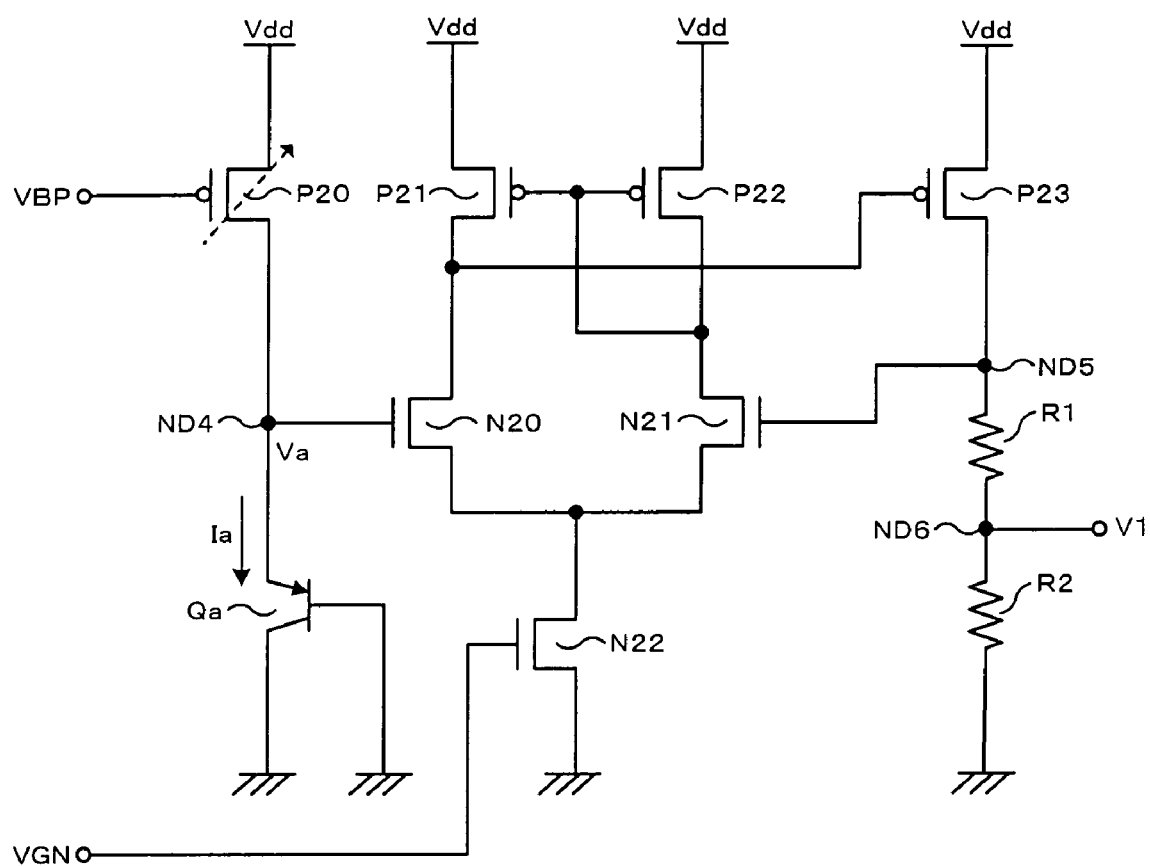
FIG. 4 is a view showing an example of a circuit configuration of a temperature-dependent voltage source.

FIG. 4 is a view showing an example of the circuit configuration of the temperature-dependent voltage source 12. The temperature-dependent voltage source 12 shown in FIG. 4 is composed of PMOS transistors P20, P21, P22 and P23, NMOS transistors N20, N21 and N22, a PNP transistor Qa as a bipolar transistor, and resistors R1 and R2. In such a configuration, the PMOS transistor P20 forms a current mirror with the PMOS transistor P10 in FIG. 3, and the reference voltage VBP is applied to the gate of the PMOS transistor P20. Therefore, a current Ia to which above-described current I0 is transmitted through the PMOS transistor P20 flows thorough the PNP transistor Qa.

Herein, since the base and the collector of the PNP transistor Qa are connected to ground, the transistor Qa serves as an inserted diode having an anode connected to node ND4 and a cathode connected to ground. And, a voltage Va having a negative temperature dependency is generated based on the diode characteristic. In this case, a relationship between the voltage Va and the current Ia is represented by following formulas:

$$Ia = Aa \cdot Is \cdot \exp\left(\frac{q \cdot Va}{n \cdot k \cdot T}\right) \tag{2}$$

-continued $$Va = \frac{n \cdot k \cdot T}{q} \cdot \ln\left(\frac{Ia}{Aa \cdot Is}\right) \quad (3)$$

where Aa: emitter area of PNP transistor Qa
Is: saturation current

As shown in FIG. 4, the voltage Va generated at node ND4 is applied to the gate of the NMOS transistor N20. In FIG. 4, the PMOS transistors P21, P22 and P23, and the NMOS transistors N20, N21 and N22 form a voltage follower as a non-inverting amplifier. In a state in which the reference voltage VGN is applied to the gate of the NMOS transistor N22, a voltage following the voltage Va is generated in node ND5 to which the gate of the NMOS transistor N21 is connected. Furthermore, the above-described voltage follower forms a voltage dividing circuit with the resistors R1 and R2 which are series-connected to the PMOS transistor P23, and the voltage Va is divided by the voltage division ratio r thereof to generate a voltage V1 at node ND6. The voltage V1 is represented by a following formula:

$$V1 = \frac{R2}{R1 + R2} \cdot Va = r \cdot Va \quad (4)$$

where $$r = R2/(R1 + R2)$$

In the first embodiment, the voltage division ratio r of the resistors R1 and R2 in the formula (4) is adjusted to change a level of the voltage V1 output from the temperature-dependent voltage source 12, thereby controlling the temperature dependency of the timer period of the self-refresh timer circuit 1. This will be described in detail later.

Figure 5:
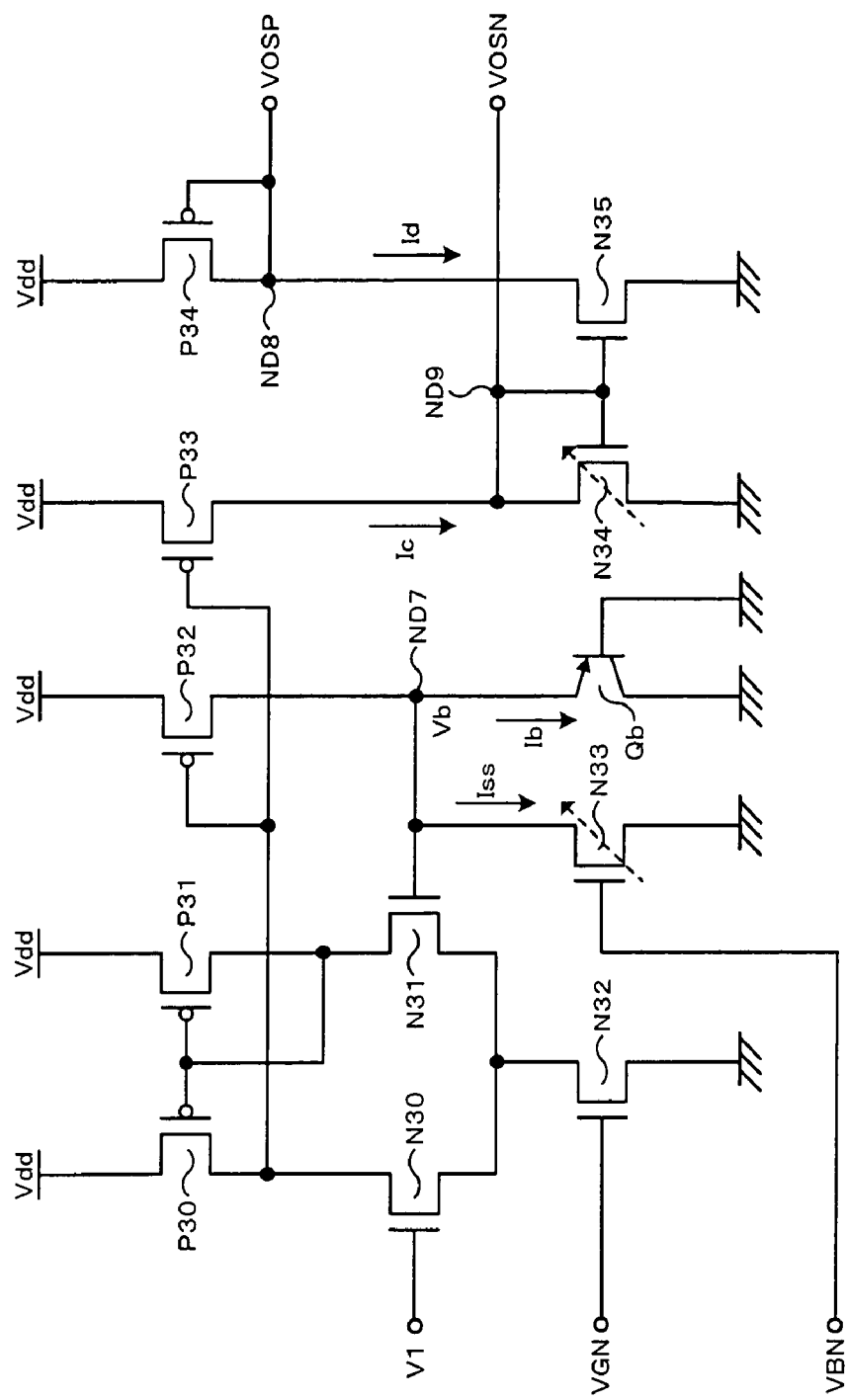
FIG. 5 is a view showing an example of a circuit configuration of a control current generating circuit.

FIG. 5 is a view showing an example of the circuit configuration of the control current generating circuit 13. The control current generating circuit 13 shown in FIG. 5 is composed of PMOS transistors P30 to P34, NMOS transistors N30 to N35 and a PNP transistor Qb. In such a configuration, the voltage V1 output from the temperature-dependent voltage source 12 is applied to the gate of the NMOS transistor N30. The PMOS transistors P30 to P32 and the NMOS transistors N30 to N32 form a voltage follower, which generates a voltage Vb following the voltage V1 at node ND7 to which the gate of the NMOS transistor N31 is connected. The PNP transistor Qb whose base and collector are connected to ground serves as a diode, and a current Ib flows through node ND7.

The PNP transistor Qb has a function as the temperature detecting diode 13a shown in FIG. 2. Herein, a relationship between the voltage Vb and the current Ib in the PNP transistor Qb is represented by following formulas similarly to the formulas (2) and (3):

$$Ib = Ab \cdot Is \cdot \exp\left(\frac{q \cdot Vb}{n \cdot k \cdot T}\right) \quad (5)$$

$$Vb = \frac{n \cdot k \cdot T}{q} \cdot \ln\left(\frac{Ib}{Ab \cdot Is}\right) \quad (6)$$

where Ab: emitter area of PNP transistor Qb

A following formula (7) can be derived from the formula (5) by using the formulas (3) and (4) when setting Vb=V1.

$$\begin{aligned} Ib &= Ab \cdot Is \cdot \exp\left(\frac{q \cdot V1}{n \cdot k \cdot T}\right) \\ &= Ab \cdot Is \cdot \exp\left(r \cdot \ln\left(\frac{Ia}{Aa \cdot Is}\right)\right) \\ &= Ab \cdot Is \cdot \exp\left(\ln\left(\frac{Ia}{Aa \cdot Is}\right)^r\right) \\ &= Ab \cdot Is \cdot \left(\frac{Ia}{Aa \cdot Is}\right)^r \\ &= N \cdot Aa^{(1-r)} \cdot Ia^r \cdot Is^{(1-r)} \end{aligned} \quad (7)$$

where N=Ab/Aa (emitter area ratio of two PNP transistors)

As represented by the formula (7), it is possible to change coefficient of powers of temperature of the current Ib by adjusting the voltage division ratio r. And, it is possible to change coefficient of the current Ib by adjusting the emitter area ratio N of the PNP transistors Qa and Qb. On a logarithmic graph, coefficient of powers of temperature corresponds to the temperature dependency (slope) and the coefficient of the current Ib corresponds to logarithmic level (absolute value). And, it is possible to change the logarithmic level of the current Ib also when adjusting the current Ia by the channel width ratio of the PMOS transistors P10 (FIG. 3) and P20 (FIG. 4).

As shown in FIG. 5, since the PMOS transistor P32 through which the current Ib flows forms a current mirror with the PMOS transistor P33, the current Ib is transmitted to a current Ic through the PMOS transistor P33. Further, since the PMOS transistors P33 and P34 also form a current mirror, the current Ic is further transmitted to a control current Id through the PMOS transistor P34. The current Ic and the control current Id are in proportion to the above-described current Ib. Then, a voltage VOSP is output from node ND8 and a voltage VOSN is output from node ND9. The function of an NMOS transistor N33 will be described later.

Figure 6:
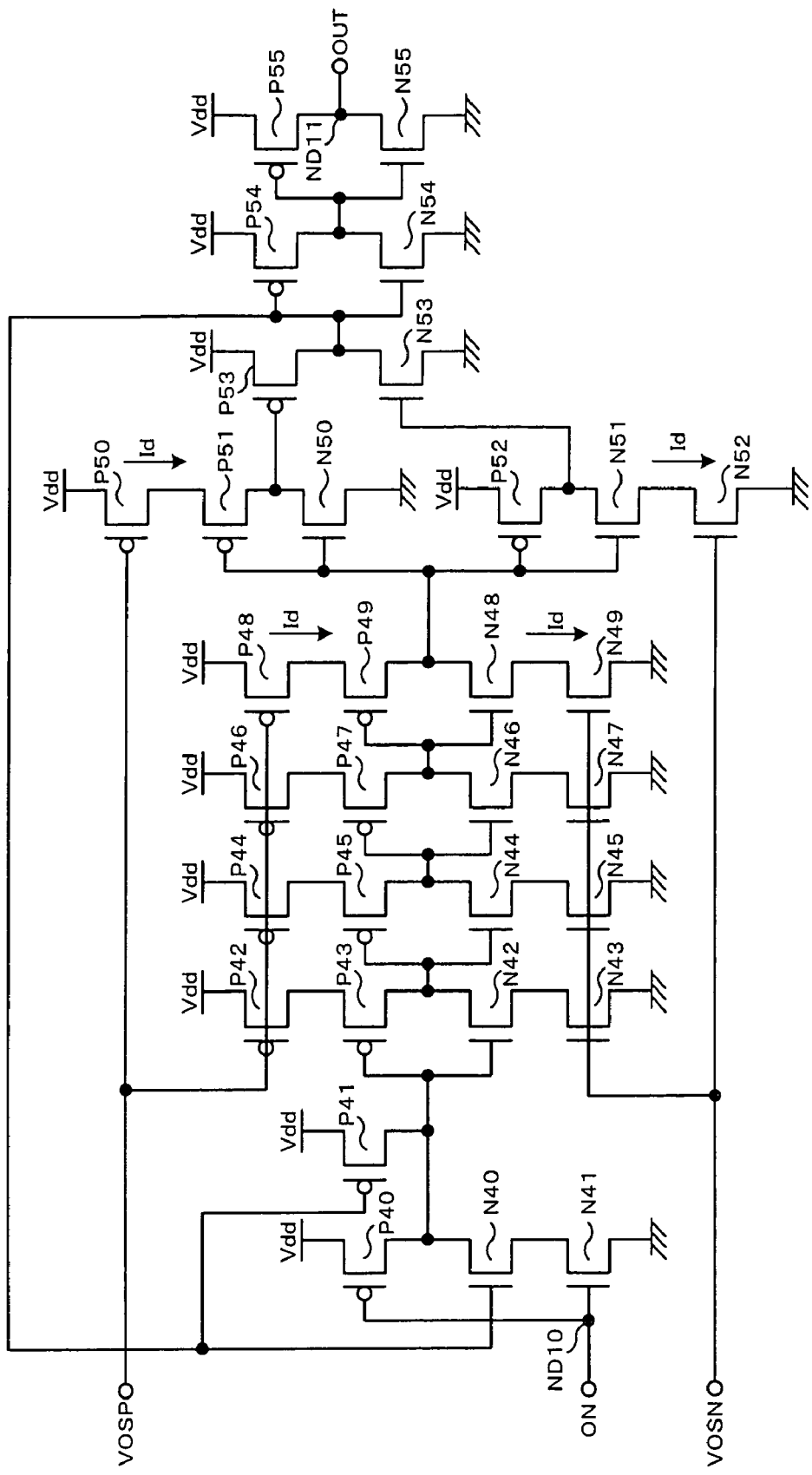
FIG. 6 is a view showing an example of a circuit configuration of a current control oscillation circuit.

FIG. 6 is a view showing an example of the circuit configuration of the current control oscillation circuit 14. The current control oscillation circuit 14 shown in FIG. 6 is composed of PMOS transistors P40 to P55 and NMOS transistors N40 to N55. As shown in FIG. 6, four-stage inverters having constant current sources on the Vdd side and the ground side and three-stage inverters are connected in feedback configuration, thereby generating an oscillation output having a constant period. The voltage VOSP is applied to each gate of the PMOS transistors P42, P44, P46, P48 and P50 as constant current sources on the Vdd side, thereby forming a current mirror with the PMOS transistor P34 shown in FIG. 5. The voltage VOSN is applied to each gate of the NMOS transistors N43, N45, N47, N49 and N52 as constant current sources on the ground side, thereby forming a current mirror with the NMOS transistor N34 shown in FIG. 5.

Herein, the PMOS transistors P42, P44, P46, P48 and P50 must have the same channel width and the NMOS transistors N43, N45, N47 and N49 must have the same channel width. By this, the common control current Id flows through each inverter. In this case, the control current Id flowing through each inverter varies in conjunction with the adjustment of sizes of the PMOS transistor P34 and the NMOS transistor N34.

The period of the oscillation output of the current control oscillation circuit 14 is determined depending on the magnitudes of the supply voltage and the control current Id and on the gate capacitance of each inverter. If it is considered that the supply voltage and the gate capacitance are fixed, the period can be flexibly controlled by changing the control current Id. Since the period depends on the charge/discharge time based on the control current Id, the period and the magnitude of the control current Id are in inverse proportion to each other. Therefore, by adjusting the control current Id in a decreasing direction, the period is prolonged, and by adjusting the control current Id in an increasing direction, the period is shortened. By appropriately adjusting the size of the NMOS transistor N34 in FIG. 5, all control currents Id flowing through the inverters can be changed at the same time. In this case, the temperature dependency of the current Ic flowing through the NMOS transistor N34 is transmitted as the temperature dependency of the control current Id, thereby determining the temperature dependency of the timer period.

In FIG. 6, a control signal ON is input to node ND10 for controlling oscillation operation of the current control oscillation circuit 14. And an oscillation output OUT having a constant period is output from node ND11. The oscillation output OUT is divided by the dividing circuit 15 of the next stage to be the timer period signal.

Figure 7:
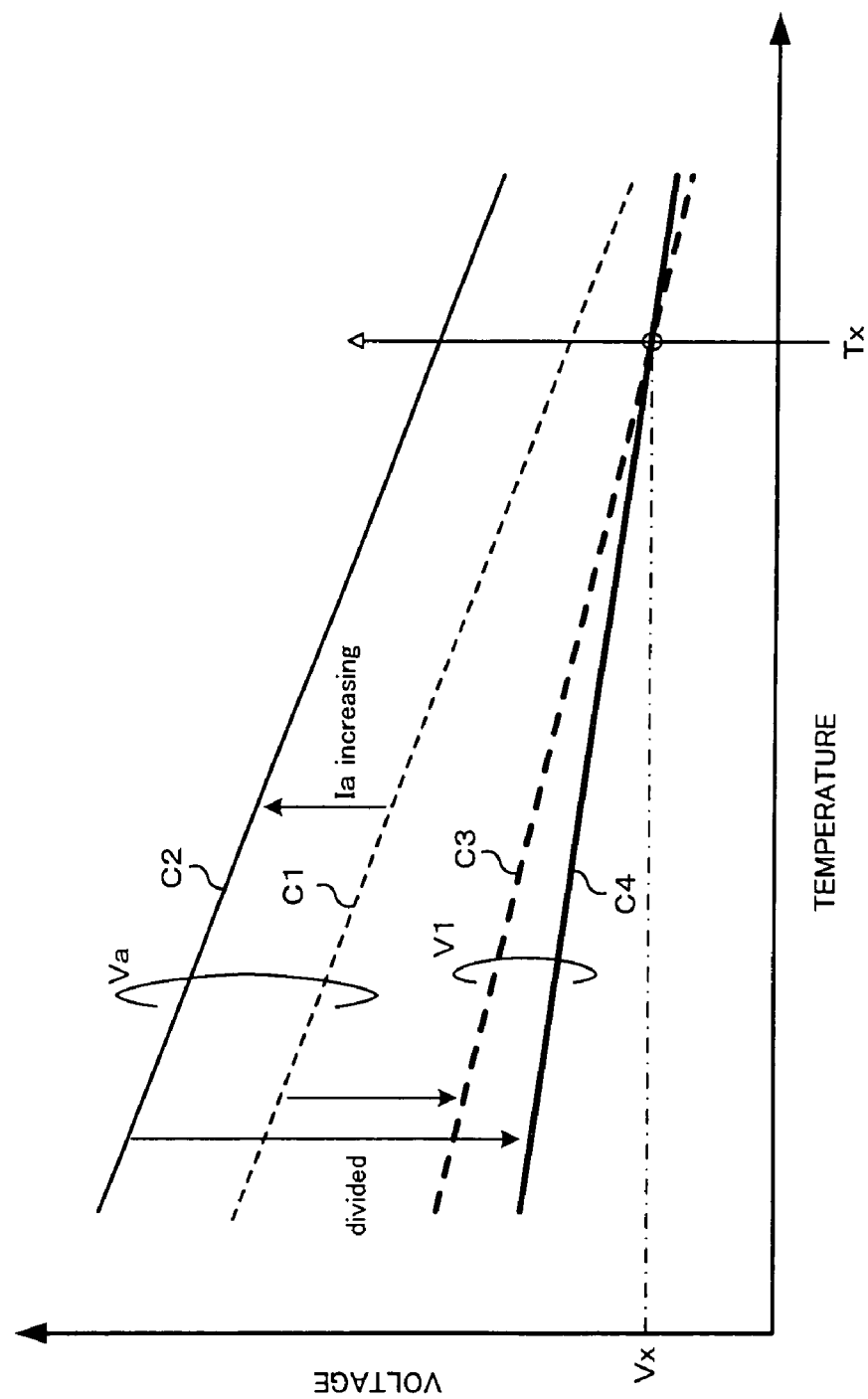
FIG. 7 is a graph showing a temperature characteristic of the voltage (Va and V1)

Next, the temperature characteristic of the timer period and specific method of adjusting the same will be described in connection with the self-refresh timer of the first embodiment. FIG. 7 is a graph showing the temperature characteristic of the voltage (Va and V1 in FIG. 4). First, in a state in which the predetermined current Ia flows through the PNP transistor Qa, the voltage Va varies according to a temperature characteristic C1. And, in a case in which the current Ia is increased from the state of the temperature characteristic C1, the voltage Va varies according to a temperature characteristic C2. For example, when the channel width ratio w1 of the PMOS transistor P10 in FIG. 3 and the PMOS transistor P20 in FIG. 4 is changed, the temperature characteristics C1 and C2 different from each other can be flexibly set. The channel width ratio w1 corresponds to a mirror ratio of the current mirror.

Both the temperature characteristics C1 and C2 have a negative temperature dependency, and the temperature dependency thereof are substantially similar to each other. This is a reflection that the saturation current Is has a strong positive temperature dependency at the voltage Va represented by the formula (3). That is, the saturation current Is can be represented by a following formula (8):

$$Is(t) = Is(T0) \cdot \left(\frac{T}{T0}\right)^{\frac{XTI}{N}} \cdot \exp\left\{\frac{Eg \cdot q \cdot (T - T0)}{n \cdot k \cdot T \cdot T0}\right\} \qquad (8)$$

where T0: measured temperature

Eg: energy gap

XT1: coefficient of powers of temperature of characteristic of saturation current (in general, XTI=3 for silicon)

In the formula (8), since a change in an exponential function component to the temperature is larger than that of a T/T0 component, the saturation current Is varies exponentially with the temperature. Herein, a following formula (9) is derived from the formula (3).

$$Va = \frac{n \cdot k \cdot T}{q} \cdot \{ln(Ia) - ln(Is)\} + K \quad (K: \text{constant}) \qquad (9)$$

In the formula (9), since an ln(Is) component is dominant regarding the temperature dependency. Thus, as represented by the temperature characteristics C1 and C2 in FIG. 7, the voltage Va decreases according to the increase of the temperature, while an absolute value of the voltage Va mainly varies with variation of the current Ia.

On the other hand, in the case of the voltage V1 (FIG. 4) divided by the resistors R1 and R2, a temperature characteristic C3 is obtained in relation to the characteristics C1, and a temperature characteristic C4 is obtained in relation to the characteristics C2. It is found that the temperature dependency of the characteristics C3 and C4 is smaller than the characteristics C1 and C2 of the voltage Va. That is, the slopes of the temperature characteristics C2 and C4 are gentle and the change rate to the temperature variation decreases. This is a reflection of a calculation result which is simply V1=r·Va as represented by the formula (4).

Herein, in the first embodiment, the temperature characteristics C3 and C4 having a temperature dependencies different from each other cross at a high-temperature measurement point Tx in FIG. 7, with identical voltage value Vx. When adjusting the temperature dependency at the high-temperature measurement point Tx by using the above-described method, it is possible to always maintain a state in which an intersection of the high-temperature measurement point Tx and the voltage value Vx is fixed, for example by appropriately adjusting the channel width ratio w1 of the PMOS transistor P10 and P20.

Figure 8:
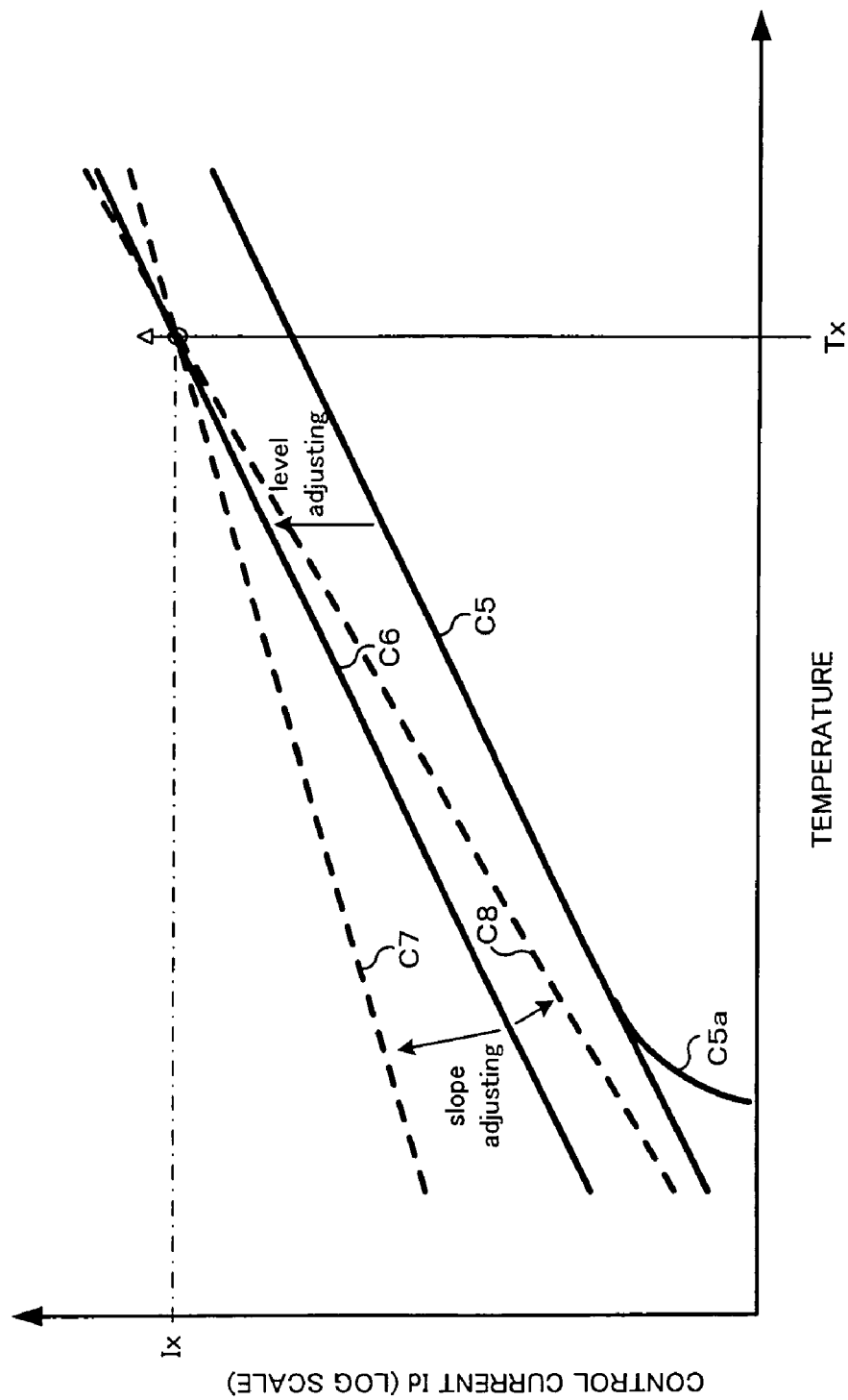
FIG. 8 is a graph showing a temperature characteristic of a control current in the current control oscillation circuit of the first embodiment.

Next, FIG. 8 is a graph showing the temperature characteristic of the control current Id in the current control oscillation circuit 14. In FIG. 8, the control current Id of the vertical axis is indicated in log scale, and the temperature of the horizontal axis is indicated in linear scale. As described above, since the current Ib is transmitted to the current Ic and to the control current Id through the current mirror, the control current Id varies in proportion to powers of temperature as represented by the formula (7). Therefore, the control current Id is represented by a straight line having a certain slope in the log scale on the graph.

First, in FIG. 8, in a case in which the control current Id varies according to a temperature characteristic C5 under a predetermined condition, if the control current Id is increased by changing the above-described channel width ratio w1, absolute values (logarithmic levels) increase to be shifted to a temperature characteristic C6. The temperature characteristic C6 is obtained by shifting the temperature characteristic C5 in the vertical direction while keeping the same slope on the graph. On the other hand, by adjusting the temperature dependency so that the intersection of the high-temperature measurement point Tx and the current value Ix is fixed according to the above-described method based on the state of the temperature characteristic C5, the line can be rotated around the intersection as represented by temperature characteristics C7 and C8.

Further, in FIG. 8, it is shown a region C5a deviated from the straight line in the low-temperature range of the temperature characteristic C5. The region C5a is a reflection of operation in a case in which the NMOS transistor N33 in FIG. 5 is not provided. That is, a phenomenon in which the current Ib abruptly decreases below a predetermined temperature is known, which is a peculiar operation of the PNP transistor Qb in low temperature. In order to avoid the deviation of the temperature characteristic in the log scale from the straight line by such a phenomenon, a configuration for compensating the decrease of the current Ib in low-temperature range by adding a compensation current Iss flowing through the NMOS transistor N33 is adopted.

Herein, when adjusting the temperature dependency of the control current Id, since the decrease of the control current Id in the region C5a becomes larger as the slope of the characteristic is larger, it is required to increase the compensation current Iss. Thus, the compensation current Iss is preferably increased, by forming the NMOS transistor N33 having variable size to increase a ratio W/L of channel width W and channel length L in conjunction with the adjustment of the temperature dependency of the current.

Accordingly, it is required to adjust following three items at the same time, when adjusting the temperature characteristic of the timer period in the configuration of the first embodiment:

(1) channel width ratio (mirror ratio) w1 of PMOS transistors P10 and P20
(2) division ratio r of resistors R1 and R2
(3) size ratio W/L of NMOS transistor N33

Figure 9:
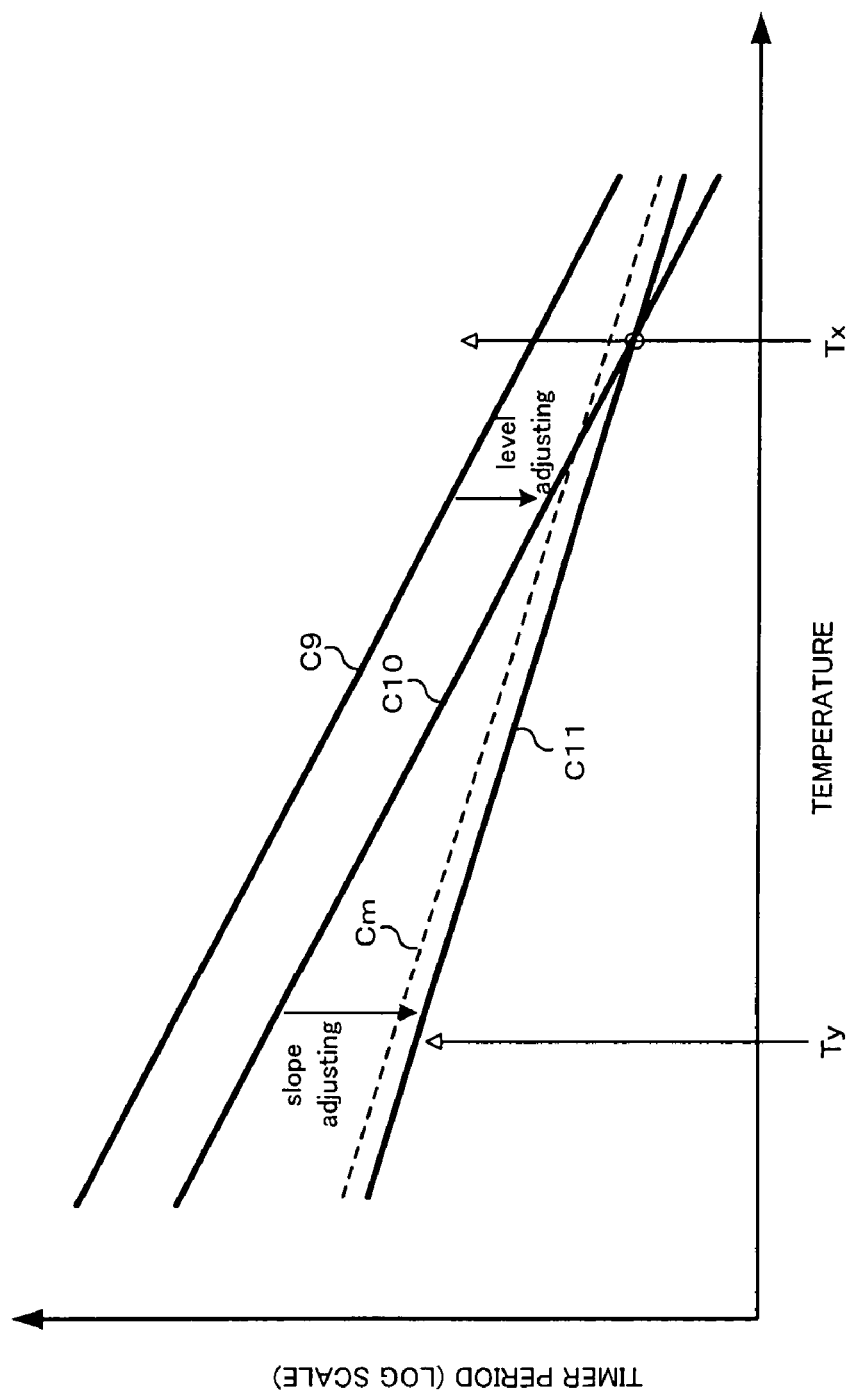
FIG. 9 is a graph showing a temperature characteristic of a timer period of the first embodiment.

Next, FIG. 9 is a graph showing the temperature characteristic of the timer period. In FIG. 9, the timer period of the vertical axis is indicated in log scale and the temperature of the horizontal axis is indicated in linear scale, as in FIG. 8. Since the timer period and the control current Id are in inverse proportion to each other as described above, the timer period is represented by a straight line having a negative slope to the temperature in the log scale on the graph. The temperature characteristics C5 and C6 obtained when adjusting the absolute value of the control current Id as shown in FIG. 8 correspond to temperature characteristics C9 and C10 in FIG. 9. In this case, when the control current Id is changed at the high-temperature measurement point Tx, the temperature characteristic can be shifted in the vertical direction of the graph in parallel to the original temperature characteristic C9. Thus, for example, shifting to the temperature characteristic C10 is possible.

In FIG. 9, a temperature characteristic Cm of the data retention time of the memory cell is also superposed. Since it is required to control the timer period so as not to finally exceed the data retention time, the adjustment is performed so that the temperature characteristic C10 has a timer period which is slightly shorter than the data retention time at the high-temperature measurement point Tx. Then, the temperature is shifted to a low-temperature measurement point Ty, and the temperature dependency of the control current Id is changed by adjusting the above-mentioned items (1), (2) and (3) at the same time based on the temperature characteristic C10. At this time, the adjustment is required to be performed so as to fix the intersection at the high-temperature measurement point Tx as described above, and thus the timer period which is slightly shorter than the data retention time at the low-temperature measurement point Ty is adjusted. By performing the adjustment at the two temperature measurement points, a temperature characteristic C11 to which the temperature characteristic Cm of the data retention time is slightly shifted downwards in parallel is obtained, thereby realizing the self-refresh timer circuit 1 capable of optimally controlling the timer period according to the temperature.

Figure 10A:
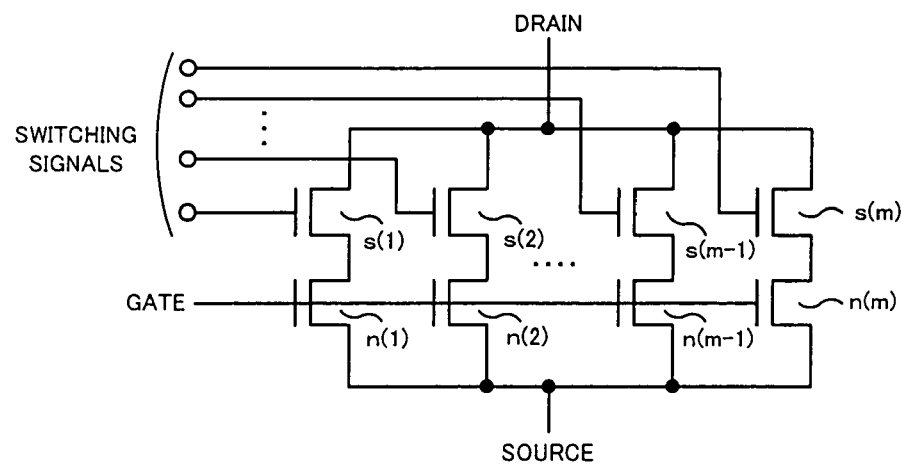
FIGS. 10A and 10B are configuration examples of a channel width switching circuit for the NMOS and PMOS transistors.
Figure 10B:
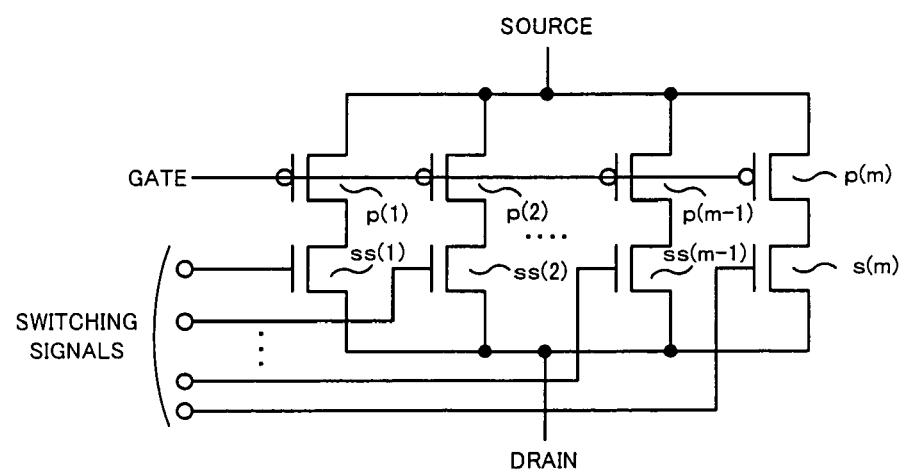

Next, a configuration example of a switching circuit required for adjusting the channel width w1 and the division ratio r in controlling the timer period will be described. FIG. 10A is a configuration example of a channel width switching circuit for the NMOS transistor, and FIG. 10B is a configuration example of a channel width switching circuit for the PMOS transistor. And, FIG. 11 is a configuration example of a division ratio switching circuit for the resistors R1 and R2.

The channel width switching circuit in FIG. 10A is composed of m NMOS transistors n(1) to n(m) having commonly connected sources and gates, and m selection switches s(1) to s(m) which are m NMOS transistors each series-connected to each of transistors n(1) to n(m) and having commonly connected drains. Switching signals different from each other are input to respective gates of the m selection switches s(1) to s(m), and by switching control of each switching signal to high or low level, any the NMOS transistors n(1) to n(m) is selectively set to ON state. At this time, by setting the channel widths different from each other for the m NMOS transistors n(1) to n(m), it becomes possible to select a desired channel width in response to the selection of the switching signal.

The channel width switching circuit in FIG. 10B is composed of m PMOS transistors p(1) to p(m) having commonly connected sources and gates, and m selection switches ss(1) to ss(m) which are m NMOS transistors each series-connected to each of transistors p(1) to p(m) and having commonly connected drains. And, as in the case of FIG. 10A, by setting any of the PMOS transistors p(1) to p(m) to ON state in response to the switching signals different from each other input to respective gates of m selection switches ss(1) to ss(m), it becomes possible to select a desired channel width from the m PMOS transistors p(1) to p(m) each having the channel width set to be different from each other.

Figure 11:
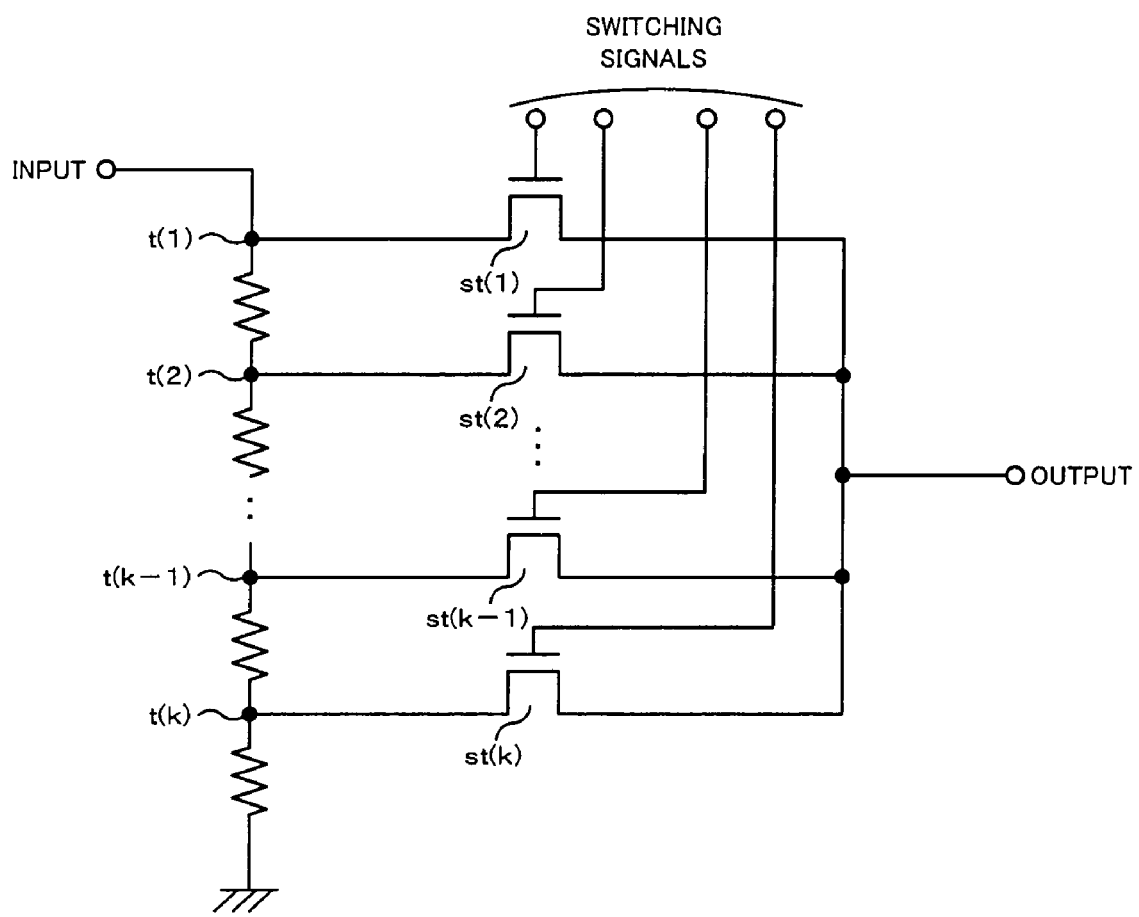
FIG. 11 is a configuration example of a division ratio switching circuit for resistors R1 and R2.

On the other hand, the division ratio switching circuit shown in FIG. 11 is configured so that k taps t(1) to t(k) on series-connected resistors having resistance R1+R2 are provided and each of the taps t(1) to t(k) is connected to selection switches st(1) to st(k) each formed of NMOS transistor. The switching signals different from each other is input to respective gates of the k selection switches st(1) to st(k), and any of the taps t(1) to t(k) can be selectively output by switching control of any of the switching signals to high level. The division ratio r is determined from the resistance R1 between the input side and the selected tap position, and the resistance R2 between the selected tap position and ground.

Second Embodiment

Hereinafter, the self-refresh timer circuit 1 of a second embodiment will be described. Basic configuration and operation of the second embodiment are similar to those of the first embodiment, except control of the temperature of the timer period. When performing self-refresh of the DRAM for mobile use, in general, reduction of consumption current is desired only above a predetermined temperature, but in many cases, drastic reduction of consumption current is not required in the low-temperature range. In such a case, if the operation current of the current control oscillation circuit 14 is extremely reduced so as to prolong the timer period in the low-temperature range as shown in FIG. 8, it causes unstable operation. Therefore in the second embodiment, a configuration in which temperature compensation of the timer period is realized in the high temperature range while stabilization of operation is realized by maintaining a constant timer period in the low-temperature range will be described.

The bias current circuit 11, the temperature-dependent voltage source 12, the current control oscillation circuit 14 and the dividing circuit 15 in the self-refresh timer circuit 1 of the second embodiment are similar to those of the first embodiment, and descriptions thereof will be omitted. In the second embodiment, the configuration of the control current generating circuit 13 is different from that of the first embodiment.

Figure 12:
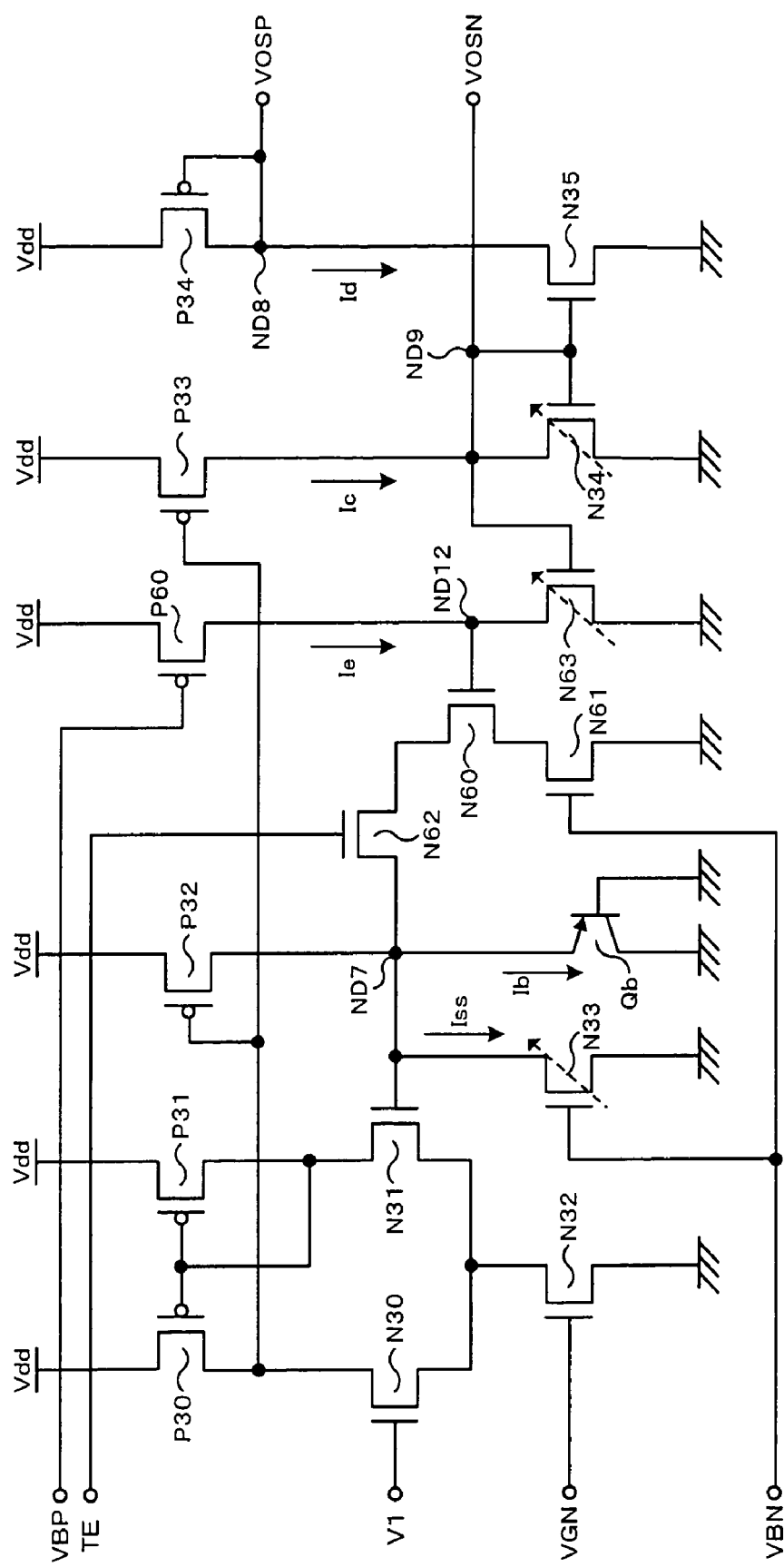
FIG. 12 is a view showing a configuration example of a control current generating circuit of the second embodiment.

FIG. 12 is a view showing a configuration example of a control current generating circuit 20 of the second embodiment. The control current generating circuit 20 shown in FIG. 12 is provided with a feedback circuit composed of PMOS transistor P60 and NMOS transistors N60, N61, N62 and N63 in addition to the components of the control current generating circuit 13 of the first embodiment. The reference voltage VBP is applied to the gate of the PMOS transistor P60, and this forms a current mirror with the PMOS transistor P10 of the bias current circuit 11. A constant current Ie flows through the PMOS transistor P60, and node ND12 is connected to the gate of the NMOS transistor N60.

In a case in which the self-refresh timer circuit 1 operates under low temperature environment, if the constant current Ie decreases when the temperature is below a predetermined temperature, the NMOS transistor N60 is set to ON state because its gate potential is increased. At this time, drawing current flows from node ND7 through the NMOS transistors N62, N60 and N61, and thus the current flowing through the PMOS transistor P32 increases. Then, the current flowing through the PMOS transistor P33 which forms a current mirror with the PMOS transistor P32 also increases, thereby increasing the gate potential of the NMOS transistor N63 through node ND9. Thereby, since the current flowing through the NMOS transistor N63 is increased, the gate potential of the NMOS transistor N60 is decreased to reduce the above-described drawing current.

Since the feedback loop acts in such a way, a state in which the constant current Ie flows through the NMOS transistor N63 is balanced. And, a constant current Ic in proportion to the constant current Ie flows through the NMOS transistor N34 which forms a current mirror with the NMOS transistor N63. Consequently, the control current Id is also in proportion to the constant current Ie. At this time, the magnitude of a constant control current Id flowing when the temperature is low can be adjusted according to the channel widths of the NMOS transistors N63 and N34. The control current Id is represented by a following formula (10) in which channel widths of the NMOS transistors N63, N34 and N35 are represented by Wx, Wy and Wz, respectively:

$$Id = \frac{Wz}{Wy} \cdot Ic = \frac{Wz}{Wy} \cdot \frac{Wy}{Wx} \cdot Ie = \frac{Wz}{Wx} \cdot Ie \quad (10)$$

Therefore, a constant current value as the control current Id under low temperature environment can be adjusted according to the channel width ratio of the NMOS transistor N63 to the NMOS transistor N35. On the other hand, under high temperature environment above a predetermined temperature, the current Ib of the PNP transistor Qb increases, and the current Ic also increases. Thereby, the gate potential of the NMOS transistor N63 increases. At this time, if a current larger than the constant current Ie can be flowed through the NMOS transistor N63, the gate potential of the NMOS transistor N60 is decreased below the threshold thereof to be in a cutoff state, and the drawing current from node ND7 stops flowing. As described above, by using the feedback circuit, it becomes possible to perform control such that the drawing current flows by a negative feedback in the low temperature to maintain the control current Id and the drawing current stops flowing automatically in the high temperature.

In addition, in FIG. 12, a test signal TE is applied to the gate of the NMOS transistor N62. By the test signal TE, the NMOS transistor N62 is set to ON state to operate the feedback circuit in normal operation, while the NMOS transistor N62 is set to OFF state to stop the feedback circuit in test operation.

Figure 13:
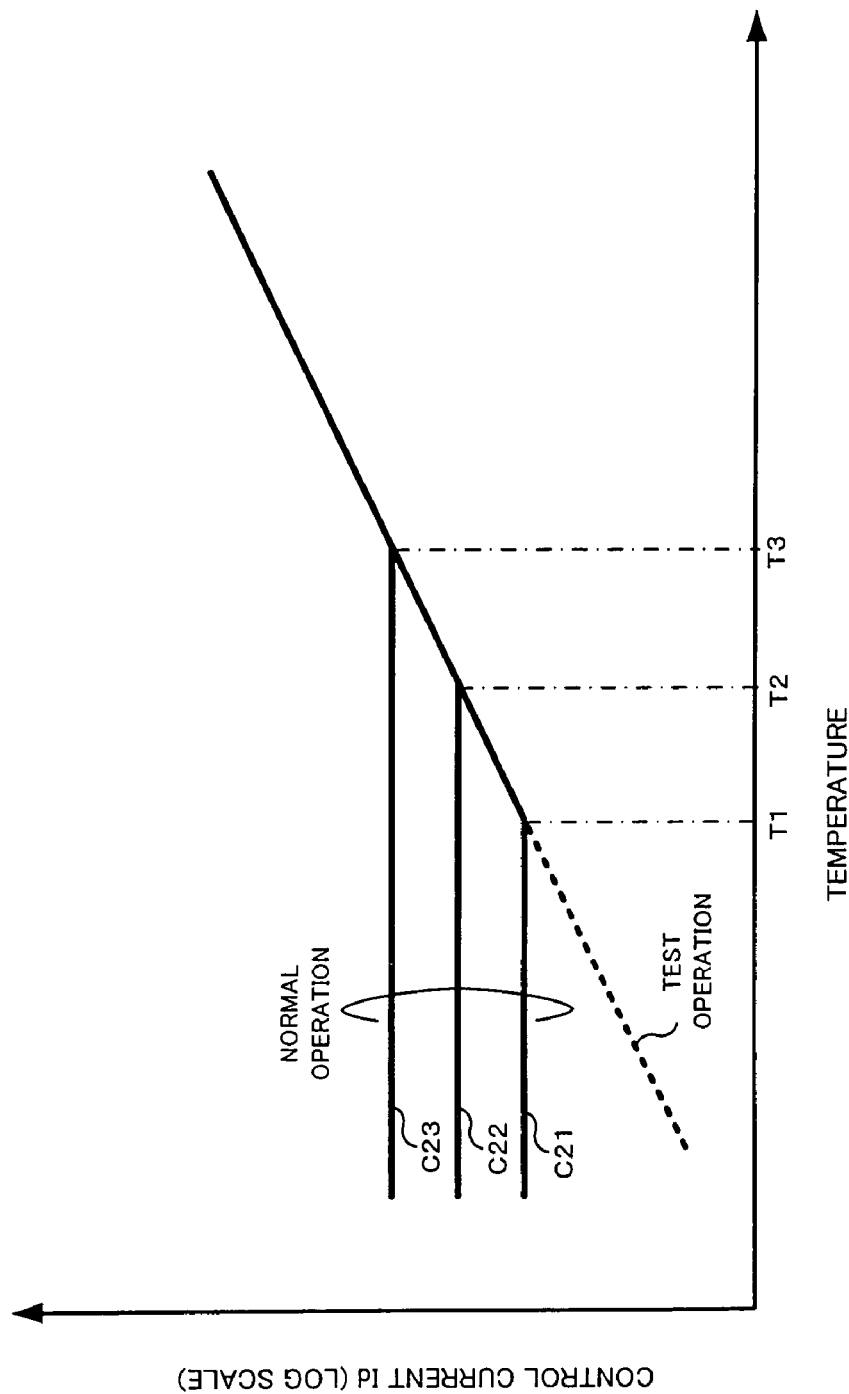
FIG. 13 is a graph showing temperature characteristics of a control current in a current control oscillation circuit of the second embodiment.

FIG. 13 is a graph showing temperature characteristics of the control current Id in the current control oscillation circuit 20 of the second embodiment, which corresponds to FIG. 8 of the first embodiment. In FIG. 13, variation of characteristics in which a channel width ratio w2 of the NMOS transistors N63 and N34 are changed in a state in which a predetermined absolute value and a predetermined temperature dependency are adjusted for the control current Id. Three temperature characteristics C21, C22 and C23 shown in FIG. 13 each representing the variation of characteristics of the control current Id in the order the channel width ratio w2 is increased.

As shown in FIG. 13, each of the temperature characteristics C21, C22 and C23 varies according to the same temperature dependency in temperature range above predetermined temperatures T1, T2 and T3 respectively. On the other hand, a constant control current is maintained in each of the temperature characteristics C21, C22 and C23 in temperature range below the predetermined temperatures T1, T2 and T3 respectively. All the temperature characteristics C21, C22 and C23 are those in normal operation in which the test signal TE is set to high level. Further, in FIG. 13, a variation in which the test signal TE is set to low level and the operation is shifted to test operation is indicated by a dot line. In this manner, the variation of the characteristic in test operation is similar to that of the first embodiment shown in FIG. 8.

Figure 14:
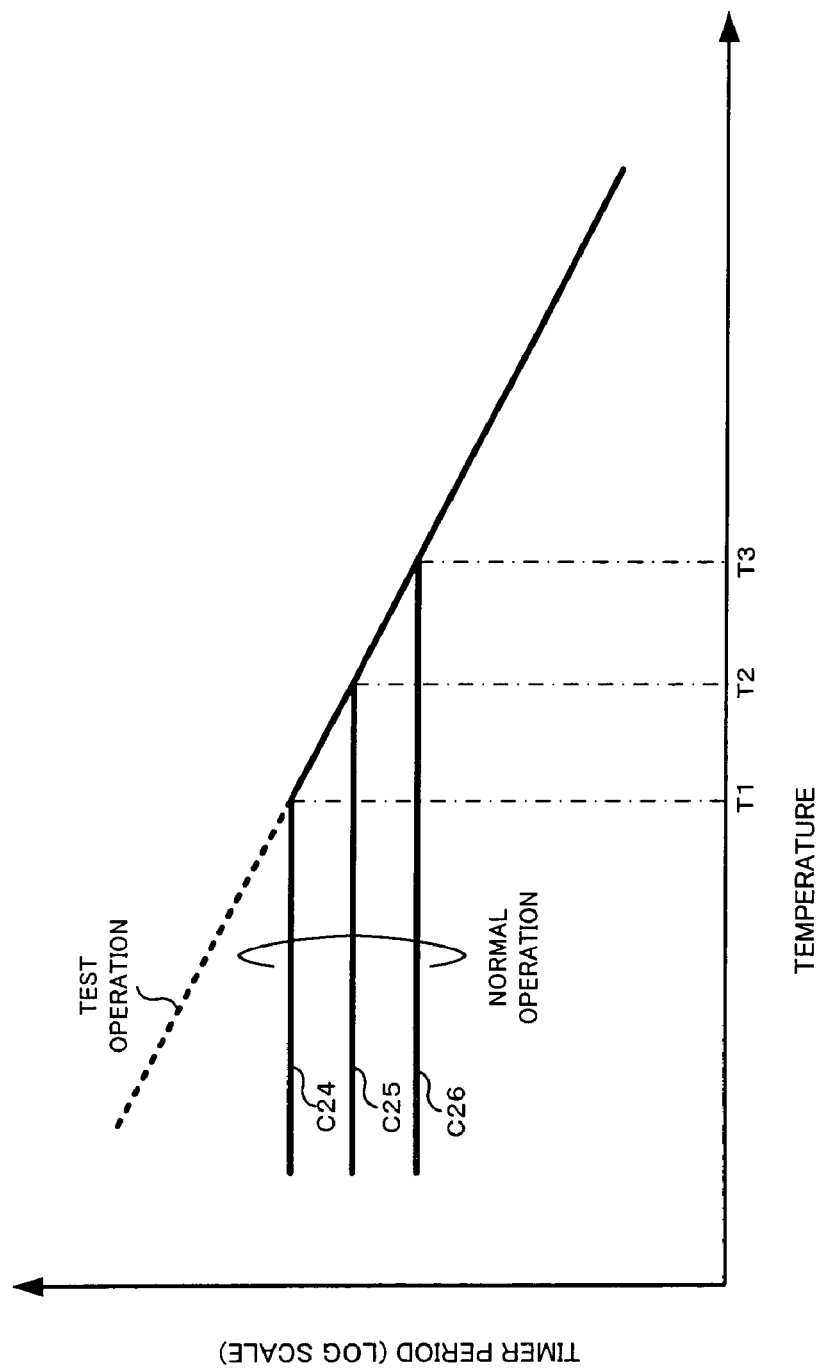
FIG. 14 is a graph showing temperature characteristics of a timer period of the second embodiment.
Figure 15:
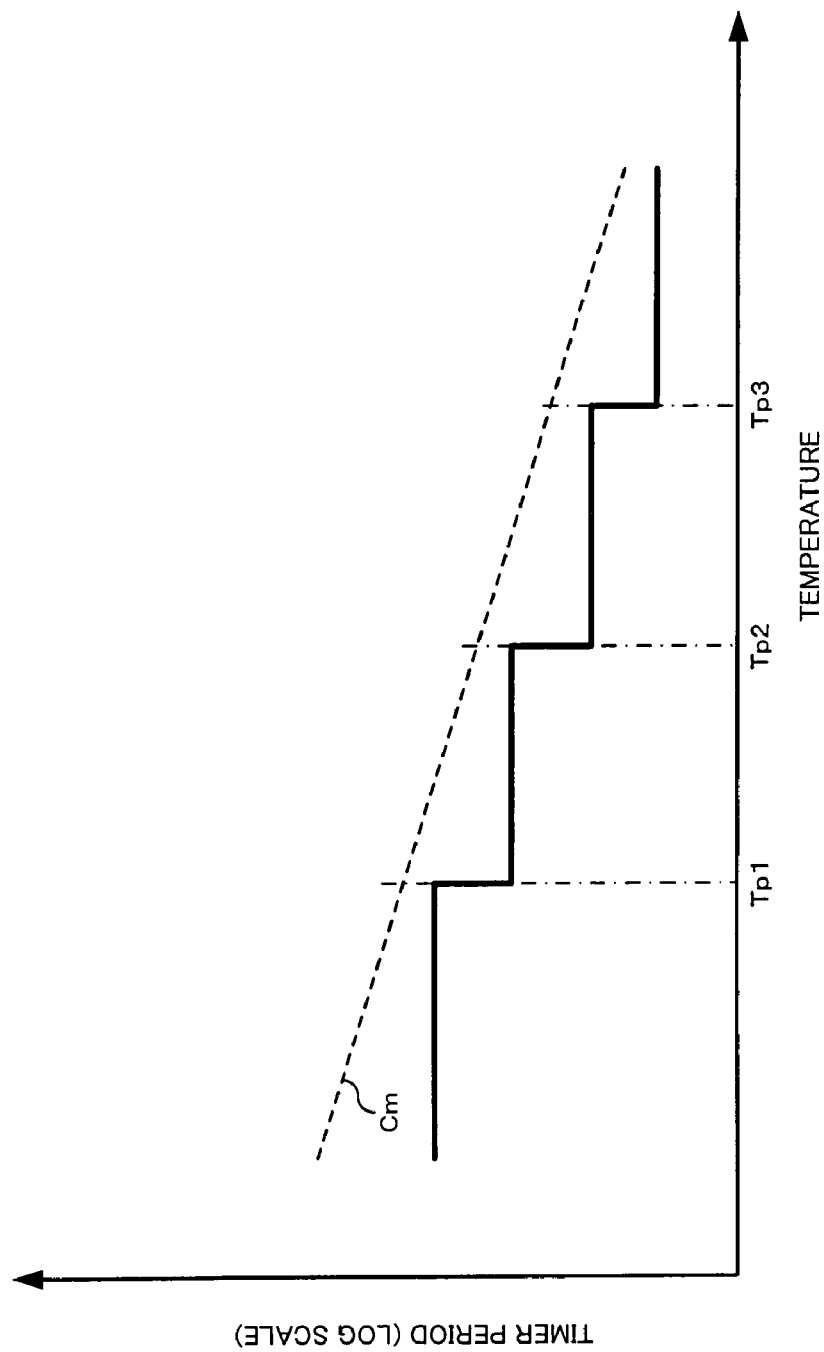
FIG. 15 is a graph showing a temperature characteristic of a timer period of a conevitional configuration.

FIG. 14 is a graph showing temperature characteristics of the timer period of the second embodiment, which corresponds to FIG. 9 of the first embodiment. Temperature characteristics C24, C25 and C26 in FIG. 14 correspond to the temperature characteristics C21, C22 and C23 in FIG. 13, respectively. In the temperature characteristics C24, C25 and C26, it is found that the timer period is not prolonged longer than the predetermined period in temperature range below predetermined temperatures T1, T2 and T3 respectively. On the other hand, in test operation, the timer period varies in the same way as that of the first embodiment in FIG. 9 as indicated by a dot line.

Although the present invention has been specifically described based on the embodiments, the present invention is not limited to the embodiments and may be variously modified within the scope of the invention. For example, without limiting to the configuration in which the temperature compensation of the timer period is performed by providing the two diode-connected PNP transistors Qa and Qb, the present invention can be applied to various other configurations. For example, the temperature-dependent voltage source 12 having a temperature dependency based on the diode characteristic can be used, and further, the PNP transistor Qb of the control current generating circuit 13 may be replaced by another temperature detecting device having the diode characteristic. And, the present invention can be applied to a configuration in which the temperature characteristics of the timer period is determined as design condition, in addition to the configuration in which the temperature characteristics is obtained by adjusting coefficient of powers of temperature and the logarithmic level of temperature in manufacturing process.

The present invention is not limited to the above described embodiments, and various variations and modifications may be possible without departing from the scope of the present invention.

This application is based on the Japanese Patent application No. 2004-359233 filed on Dec. 10, 2004, entire content of which is expressly incorporated by reference herein.

What is claimed is:

1. A self-refresh timer circuit for generating a timer period for controlling self-refresh operation of a semiconductor memory device comprising:
a temperature-dependent voltage source for outputting a voltage having a temperature dependency based on a diode characteristic;
a control current generating circuit for applying an output voltage of said temperature-dependent voltage source to a temperature detecting device having a diode characteristic and for generating a control current having a magnitude in proportion to a current flowing through said temperature detecting device;
a timer period generating circuit for generating a timer period in inverse proportion to the magnitude of said control current; and
adjusting means including first adjusting means for adjusting coefficient of powers of temperatures in a temperature characteristic of said timer period and second adjusting means for adjusting logarithmic level of the temperature characteristic of said timer period.

2. A self-refresh timer circuit according to claim 1, wherein said first adjusting means adjusts the coefficient of powers of temperature by changing the output voltage level of said temperature-dependent voltage source, and said second adjusting means adjusts the logarithmic level by changing the magnitude of said control current.

3. A self-refresh timer circuit according to claim 2, wherein said first adjusting means can select a predetermined output voltage level from a plurality of preset output voltage levels different from each other, and said second adjusting means can select a predetermined magnitude of said control current from a plurality of preset magnitude different from each other.

4. A self-refresh timer circuit according to claim 3, wherein said adjusting means can change the output voltage level and the magnitude of said control current so as to maintain the same said timer period at a preset high-temperature measurement point.

5. A self-refresh timer circuit according to claim 3 or 4, wherein said control current generating circuit generates said control current by transmitting the current flowing through said temperature detecting device using a current mirror having a mirror ratio which can be switched, and wherein said second adjusting means changes the magnitude of said control current according to switching control of said mirror ratio.

6. A self-refresh timer circuit according to claims 3 or 4, wherein said temperature-dependent voltage source outputs a voltage of a voltage dividing circuit capable of switching a division ratio of resistors, and said first adjusting means changes the output voltage level according to switching control of said division ratio.

7. A self-refresh timer circuit according to claim 1, wherein said control current generating circuit has a feedback circuit which maintains the magnitude of said control current constant beneath a predetermined temperature by a negative feedback.

8. A self-refresh timer circuit according to claim 7, wherein said control current generating circuit can change said predetermined temperature by controlling a magnitude of the negative feedback of said feedback circuit.

9. A self-refresh timer circuit according to claim 7 or 8, wherein said control current generating circuit operates said feedback circuit during normal operation is set and stops said feedback circuit during test operation is set.

10. A self-refresh timer period adjusting method for adjusting said timer period of the self-refresh timer circuit according to claim 1,
wherein it is possible to select a desired temperature characteristic to which said timer period conforms at a preset high-temperature measurement point from temperature characteristics obtained by adjusting the coefficient of powers of temperature and the logarithmic level of the temperature characteristic of said timer period.

11. A self-refresh timer period adjusting method according to claim 10, wherein it is possible to select a desired temperature characteristic by adjusting one of or both of the coefficient of powers of temperature and the logarithmic level at a preset low-temperature measurement point from temperature characteristics to which said timer period conforms at said high-temperature measurement point.

12. A self-refresh timer period adjusting method according to claim 11, wherein said timer period at said desired temperature characteristic can be adjusted so as to be slightly below a temperature characteristic determined by a data retention time of a memory cell.

* * * * *